United States Patent
Gonzalez et al.

(10) Patent No.: US 9,293,185 B2
(45) Date of Patent: Mar. 22, 2016

(54) APPARATUS INCLUDING A CAPACITOR-LESS MEMORY CELL AND RELATED METHODS

(71) Applicant: Micron Technology, Inc., Boise, ID (US)

(72) Inventors: Fernando Gonzalez, Richardson, TX (US); Chandra V. Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 138 days.

(21) Appl. No.: 14/246,896

(22) Filed: Apr. 7, 2014

(65) Prior Publication Data

US 2014/0219017 A1 Aug. 7, 2014

Related U.S. Application Data

(60) Continuation of application No. 14/050,500, filed on Oct. 10, 2013, now Pat. No. 8,724,372, which is a division of application No. 13/902,498, filed on May 24, 2013, now Pat. No. 8,582,350, which is a division (Continued)

(51) Int. Cl.
*G11C 11/24* (2006.01)
*G11C 11/401* (2006.01)
(Continued)

(52) U.S. Cl.
CPC ............ *G11C 11/401* (2013.01); *G11C 11/405* (2013.01); *G11C 11/408* (2013.01);
(Continued)

(58) Field of Classification Search
CPC ........................................................ G11C 11/24
USPC ................. 365/145, 148–150, 174–177, 184, 365/185.01–185.26, 189.011–189.2, 207; 257/133–154, 190–195, 204–214, 239, 257/260–262, 270, 278, 326–347; 438/138, 438/142, 149–164, 176, 241–243
See application file for complete search history.

(56) References Cited

U.S. PATENT DOCUMENTS

| 4,794,561 A | 12/1988 | Hsu |
| 4,890,144 A | 12/1989 | Teng et al. |

(Continued)

FOREIGN PATENT DOCUMENTS

| EP | 0731972 B1 | 11/2001 |
| EP | 1355358 A2 | 10/2003 |

(Continued)

OTHER PUBLICATIONS

Austrian Patent Office Search Report and Examination Report for SG Application No. 200905580-7, completed Jan. 5, 2010, 14 pages.

(Continued)

*Primary Examiner* — Harry W Byrne
(74) *Attorney, Agent, or Firm* — TraskBritt

(57) ABSTRACT

A capacitor-less memory cell, memory device, system and process of forming the capacitor-less memory cell include forming the capacitor-less memory cell in an active area of a substantially physically isolated portion of a bulk semiconductor substrate. A pass transistor is formed on the active area for coupling with a word line. The capacitor-less memory cell further includes a read/write enable transistor vertically configured along at least one vertical side of the active area and operable during a reading of a logic state with the logic state being stored as charge in a floating body area of the active area, causing different determinable threshold voltages for the pass transistor.

20 Claims, 10 Drawing Sheets

Related U.S. Application Data of application No. 13/524,809, filed on Jun. 15, 2012, now Pat. No. 8,451,650, which is a division of application No. 13/073,624, filed on Mar. 28, 2011, now Pat. No. 8,203,866, which is a division of application No. 11/711,449, filed on Feb. 26, 2007, now Pat. No. 7,919,800.

(51) Int. Cl.
  *G11C 11/405* (2006.01)
  *G11C 11/408* (2006.01)
  *H01L 27/108* (2006.01)
  *H01L 29/78* (2006.01)
  *H01L 29/66* (2006.01)
  *G11C 11/409* (2006.01)
  *H01L 27/07* (2006.01)

(52) U.S. Cl.
  CPC ............ *G11C11/409* (2013.01); *H01L 27/108* (2013.01); *H01L 27/10802* (2013.01); *H01L 29/66666* (2013.01); *H01L 29/7841* (2013.01); *H01L 27/0705* (2013.01)

(56) References Cited

U.S. PATENT DOCUMENTS

| | | | |
|---|---|---|---|
| 5,066,607 A | 11/1991 | Banerjee | |
| 5,285,093 A | 2/1994 | Lage et al. | |
| 5,448,513 A | 9/1995 | Hu et al. | |
| 5,798,965 A | 8/1998 | Jun | |
| 6,110,798 A | 8/2000 | Gonzalez et al. | |
| 6,479,370 B2 | 11/2002 | Gonzalez et al. | |
| 6,559,032 B2 | 5/2003 | Gonzalez et al. | |
| 6,714,436 B1* | 3/2004 | Burnett et al. | 365/149 |
| 6,756,293 B2 | 6/2004 | Li et al. | |
| 6,778,424 B2 | 8/2004 | Iwata et al. | |
| 6,784,076 B2 | 8/2004 | Gonzalez et al. | |
| 6,812,150 B2 | 11/2004 | Zheng | |
| 6,825,524 B1 | 11/2004 | Ikehashi et al. | |
| 6,861,689 B2 | 3/2005 | Burnett | |
| 6,888,200 B2 | 5/2005 | Bhattacharyya | |
| 7,045,407 B2 | 5/2006 | Keating et al. | |
| 7,085,153 B2 | 8/2006 | Ferrant et al. | |
| 7,112,513 B2 | 9/2006 | Smythe, III et al. | |
| 7,433,233 B2 | 10/2008 | Chen et al. | |
| 7,919,800 B2 | 4/2011 | Gonzalez et al. | |
| 8,203,866 B2 | 6/2012 | Gonzalez et al. | |
| 2002/0110018 A1 | 8/2002 | Ohsawa | |
| 2003/0190766 A1 | 10/2003 | Gonzalez et al. | |
| 2004/0041206 A1 | 3/2004 | Bhattacharyya | |
| 2004/0041208 A1* | 3/2004 | Bhattacharyya | 257/347 |
| 2004/0061148 A1 | 4/2004 | Hsu | |
| 2005/0013163 A1 | 1/2005 | Ferrant et al. | |
| 2005/0026354 A1* | 2/2005 | Bhattacharyya | 438/232 |
| 2005/0148147 A1 | 7/2005 | Keating et al. | |
| 2005/0250261 A1* | 11/2005 | Bhattacharyya | 438/149 |
| 2005/0280113 A1 | 12/2005 | Kim et al. | |
| 2006/0043456 A1 | 3/2006 | Derderian et al. | |
| 2006/0125121 A1 | 6/2006 | Ko et al. | |
| 2006/0131666 A1* | 6/2006 | Li et al. | 257/387 |
| 2006/0146605 A1 | 7/2006 | Bhattacharyya et al. | |
| 2007/0127289 A1 | 6/2007 | Lee | |
| 2007/0159903 A1 | 7/2007 | Kim et al. | |
| 2012/0258577 A1 | 10/2012 | Gonzalez et al. | |
| 2013/0252390 A1 | 9/2013 | Gonzalez et al. | |
| 2014/0036584 A1 | 2/2014 | Gonzalez et al. | |

FOREIGN PATENT DOCUMENTS

| | | |
|---|---|---|
| JP | 2003086712 A | 3/2003 |
| JP | 2005079314 A | 3/2005 |
| KR | 0132577 Y1 | 12/1998 |
| WO | 9515562 A1 | 6/1995 |
| WO | 2004044990 A1 | 5/2004 |
| WO | 2004102625 A2 | 11/2004 |
| WO | 2005114742 A2 | 12/2005 |
| WO | 2006026159 A1 | 3/2006 |

OTHER PUBLICATIONS

International Preliminary Report on Patentability for International Application No. PCT/US2008/054561 dated Aug. 26, 2009.
International Search Report for International Application No. PCT/US2008/054561, mailed Jul. 4, 2008, 5 pages.
International Written Opinion for International Application No. PCT/US2008/054561, mailed Jul. 4, 2008, 11 pages.
Morishita, et al., A Capacitorless Twin-Transistor Random Access Memory (TTRAM) on SOI, IEEE 2005 Custom Integrated Circuits Conference (2005), pp. 435-438.

* cited by examiner

APPARATUS INCLUDING A CAPACITOR-LESS MEMORY CELL AND RELATED METHODS

CROSS-REFERENCE TO RELATED APPLICATIONS

This application is a continuation of U.S. patent application Ser. No. 14/050,500, filed Oct. 10, 2013, now U.S. Pat. No. 8,724,372, issued May 13, 2014, which application is a divisional of U.S. patent application Ser. No. 13/902,498, filed May 24, 2013, now U.S. Pat. No. 8,582,350, issued Nov. 12, 2013, which application is a divisional of U.S. patent application Ser. No. 13/524,809, filed Jun. 15, 2012, now U.S. Pat. No. 8,451,650, issued May 28, 2013, which is a divisional of U.S. patent application Ser. No. 13/073,624, filed Mar. 28, 2011, now U.S. Pat. No. 8,203,866, issued Jun. 19, 2012, which is a divisional of U.S. patent application Ser. No. 11/711,449, filed Feb. 26, 2007, now U.S. Pat. No. 7,919,800, issued Apr. 5, 2011, the disclosure of each of which is hereby incorporated herein in its entirety by this reference.

FIELD

Various embodiments of the present invention relate generally to the field of volatile memory devices and, more particularly, to capacitor-less memory cells.

BACKGROUND

A widely utilized DRAM (Dynamic Random Access Memory) manufacturing process utilizes CMOS (Complementary Metal Oxide Semiconductor) technology to produce DRAM circuits, which comprise an array of unit memory cells, each including one capacitor and one transistor, such as a field effect transistor. In the most common circuit designs, one side of the transistor is connected to one side of the capacitor, the other side of the transistor and the transistor gate are connected to external circuit lines called the digit line and the word line, and the other side of the capacitor is connected to a reference voltage. In such memory cells, an electrical signal charge is stored in a storage node of the capacitor connected to the transistor that charges and discharges the circuit lines of the capacitor.

Higher performance, lower cost, increased miniaturization of components, and greater packaging density of integrated circuits are ongoing goals of the computer industry. In pursuit of increased miniaturization, DRAM chips have been continually redesigned to achieve ever higher degrees of integration. However, as the dimensions of the DRAM chips are reduced, the occupation area of each unit memory cell of the DRAM chips must be reduced. This reduction in occupied area necessarily results in a reduction of the dimensions of the capacitor, which, in turn, makes it difficult to ensure required storage capacitance for transmitting a desired signal without malfunction. However, the ability to densely pack the unit memory cells, while maintaining required capacitance levels, results in the necessity to build taller or deeper capacitors in order to maintain adequate charge storage for adequate data retention. Accordingly, taller or deeper capacitors results in aspect ratios that require expensive processes and result in increased opportunities for defects.

Specialized fabrication processes unique to the formation of large aspect ratio devices such as capacitors do not lend themselves to being integrated with logic devices such as controllers or processors. Therefore, it would be advantageous to develop a data storage cell capable of high-density fabrication while not utilizing overly peculiar processing steps that are incompatible with logic device fabrication techniques.

DETAILED DESCRIPTION

Figure 1:
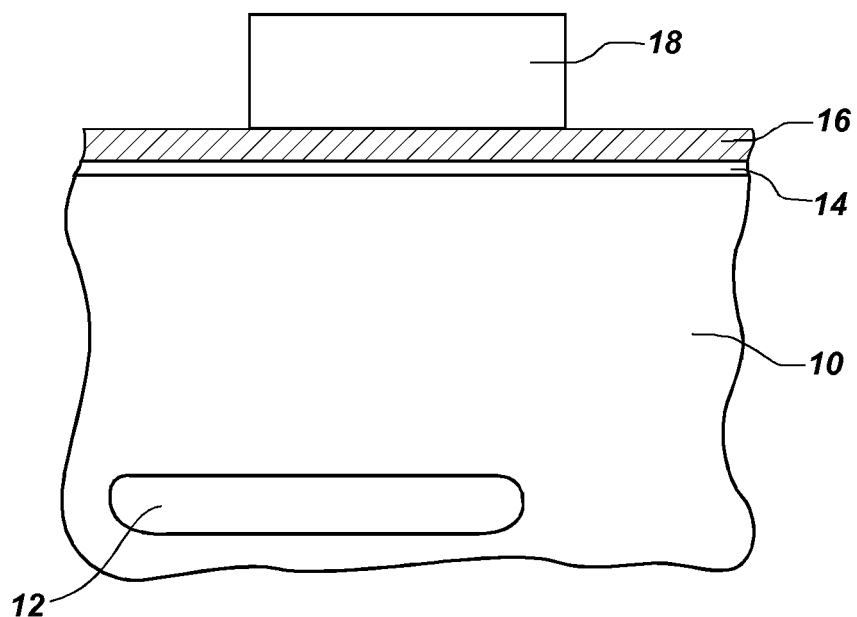
FIG. 1 is a cross section of a formation of a structure, in accordance with an embodiment of the present invention.

In the following detailed description, reference is made to the accompanying drawings, which form a part hereof, and in which is shown by way of illustration specific embodiments in which the invention may be practiced. These embodiments are described in sufficient detail to enable those skilled in the art to practice the invention, and it is to be understood that other embodiments may be implemented, and that structural, logical and electrical changes may be made without departing from the spirit and scope of the present invention.

Embodiments of a capacitor-less memory cell, memory device, system and process of forming the capacitor-less memory cell are disclosed. The capacitor-less memory cell is formed according to a partial silicon-on-insulator (SOI) technique, wherein the active area is formed from a substantially physically isolated portion of the bulk semiconductor substrate. A pass transistor is formed on the active area and includes a pass transistor including a source region and a drain region for coupling with a digit line. A gate of the pass transistor is configured for coupling with a word line. The capacitor-less memory cell further includes a read/write enable transistor including a gate, a source region and a drain region commonly shared with the source region of the pass transistor. The read/write enable transistor is vertically configured along at least one vertical side of the active area and activated, or operable, during a reading of a logic state with the logic state being stored as charge in a floating body area of the active area, causing different determinable threshold voltages for the pass transistor.

An embodiment of a process for forming a capacitor-less memory cell is also disclosed. The process includes etching an active area from a bulk semiconductor substrate with the active area being substantially physically isolated from the bulk semiconductor substrate in a partial SOI process. A read/write enable transistor is formed and includes a gate, a source region and a drain region commonly shared with the source region of the pass transistor. The read/write enable transistor is vertically configured along at least one vertical side of the active area and configured to be activated, or operable, during a reading of a logic state. The process further includes forming a pass transistor in the active area with the pass transistor including a source region, a drain region for coupling with a digit line and a gate for coupling with a word line. A logic state is stored as charge in a floating body area of the active area, causing different determinable threshold voltages for the pass transistor.

An embodiment of a memory device is also disclosed, which embodiment includes a memory array including a plurality of capacitor-less memory cells. Each of the plurality of capacitor-less memory cells includes an active area formed from a substantially physically isolated portion of a bulk semiconductor substrate with a pass transistor formed on the active area. The pass transistor includes a source region, a drain region for coupling with a digit line and a gate for coupling with a word line. Each of the plurality of capacitor-less memory cells further includes a read/write enable transistor including a gate, a source region and a drain region commonly shared with the source region of the pass transistor. The read/write enable transistor is vertically configured along at least one vertical side of the active area and activated, or operable, during a reading of a logic state with the logic state being stored as charge in a floating body area of the active area, causing different determinable threshold voltages for the pass transistor. The memory device also includes addressing and sensing circuitry coupled to the memory array and configured to select and read and write to selected ones of the plurality of capacitor-less memory cells.

An embodiment of a semiconductor wafer including at least one memory device including a plurality of capacitor-less memory cells thereon is also disclosed.

Embodiments of electronic systems including input, output, processor and memory devices are also disclosed. In one embodiment of the present invention, the electronic system includes the input, output, processor and memory devices operably coupled together. In another embodiment of the present invention, the input, output, and processor devices are operably coupled together and the memory device is integrated into the processor device. The capacitor-less memory cells are further formed and configured as described herein.

In one embodiment as depicted in FIG. 1, a substrate 10 is provided, which includes a semiconductive material. The terms "wafer" and "substrate" used in the following description include any structure having an exposed surface, on or in which an integrated circuit (IC) structure relating to embodiments of the present invention may be formed. The term substrate includes, without limitation, semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures known to one skilled in the art. The team "conductor" includes semiconductors, and the term "insulator" or "dielectric" includes any material that is less electrically conductive than the materials referred to as conductors.

The illustrated portion of the substrate 10 may also be a portion of an implanted "tub" region of, for example, a p-type doped region of a differently doped greater substrate. The substrate 10 has an implant region 12 formed through ion implantation into the substrate 10 according to conventional implant techniques, including masking, to form an implant region that is offset in one direction as illustrated and, in one embodiment, implant region 12 is formed to result in an n-type region. The substrate 10 also includes a pad oxide layer 14 deposited thereon. As used herein, the term "deposited" is used broadly to mean layers that are not only deposited in the traditional sense, but layers of material that are grown or in any other manner caused to be formed. A protective layer 16 is deposited on top of the pad oxide layer 14 to act as a buffer during subsequent etch steps and other processing. In one embodiment, the protective layer 16 is polysilicon. In another embodiment, the protective layer 16 is a nitride material. In yet another embodiment, the protective layer 16 is a polysilicon layer that is covered with a nitride material. The specific combination is selected depending upon process integration choices.

A mask 18 is formed and patterned upon the protective layer 16. In one embodiment, the mask 18 is a photoresist material that is spun on, exposed, cured, and patterned. In another embodiment, the mask 18 is a hard mask material such as a nitride or oxide. The area protected by the mask 18 defines what will become an active area in a partial silicon-on-insulator (SOI) structure used to fond a capacitor-less memory cell.

Figure 2:
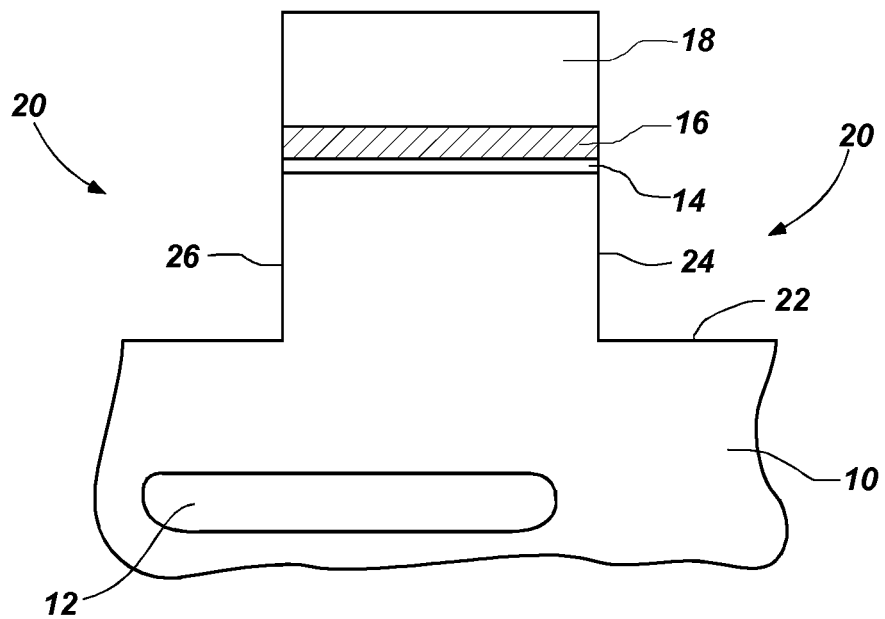
FIG. 2 is a cross section of a further formation of the structure of FIG. 1, in accordance with an embodiment of the present invention.

FIG. 2 illustrates an embodiment after an etch process that has exposed the regions unprotected by the mask 18. In the etch process, the protective layer 16 and the pad oxide layer 14 have also been patterned, and a recess 20 has been formed with a recess first bottom 22 and an upper first wall 24 and an upper second wall 26. It should be noted that only a cross section of the structure is illustrated in FIGS. 1 through 11 and therefore upper third and fourth walls are not illustrated but are located on adjacent sides of upper first wall 24 and upper second wall 26.

Figure 3:
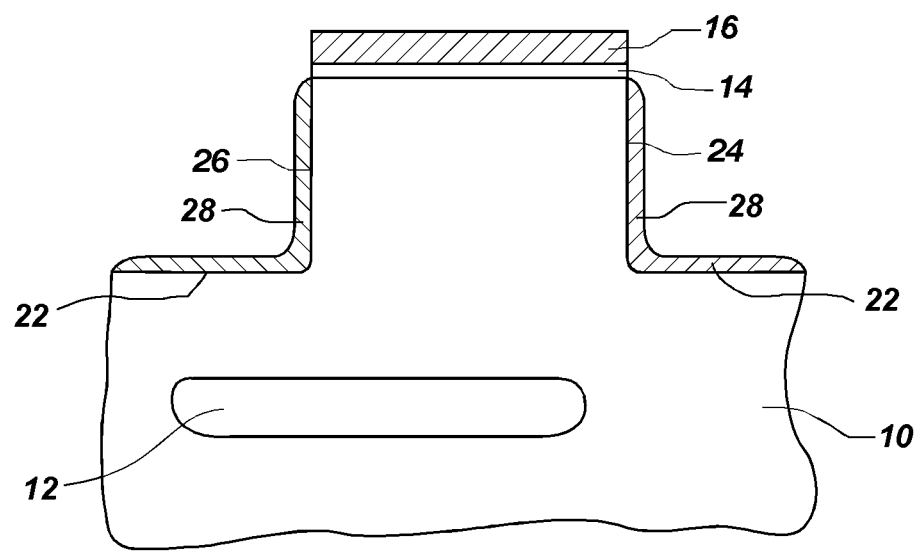
FIG. 3 is a cross section of a further formation of the structure of FIG. 2, in accordance with an embodiment of the present invention.

FIG. 3 illustrates the structure depicted in FIG. 2 after further processing in which the mask 18 has been removed and a nitride film 28 has been grown onto the exposed semiconductive material of the substrate 10. In one embodiment, the exposed semiconductive material of the substrate 10 is exposed silicon. The nitride film 28 is depicted as covering the recess first bottom 22, the upper first wall 24 and upper second wall 26. The nitride film 28 may be grown by known processes under conditions that deposit only upon semiconductive material such as exposed silicon. One such process is remote-plasma nitridation (RPN). In RPN, a nitride-bearing plasma is struck, remote from substrate 10, but within the deposition tool, and the nitride-bearing plasma is carried by convective force toward the substrate 10. Another process that may be used to form the nitride film 28 is rapid thermal nitridation (RTN). Such processing is also known in the art.

Alternative to the formation of a nitride film 28, an oxide film may be formed, either by remote-plasma oxidation (RPO) or by rapid thermal oxidation (RTO) or in situ steam generation (ISSG) or low-pressure radical oxidation (LPRO). Similarly, a combination of an oxide and a nitride is formed according to an embodiment as set forth herein. In one embodiment, the placement of the oxide precedes the placement of the nitride, or vice versa. Similarly, an oxynitride film is formed in the place of the nitride film 28 according to an alternative embodiment. The process is carried out by either a remote plasma process or a rapid thermal process. Although not limiting the embodiments disclosed, for convenience throughout the remainder of the disclosure, the film 28 is referred to as the nitride film 28.

Figure 4:
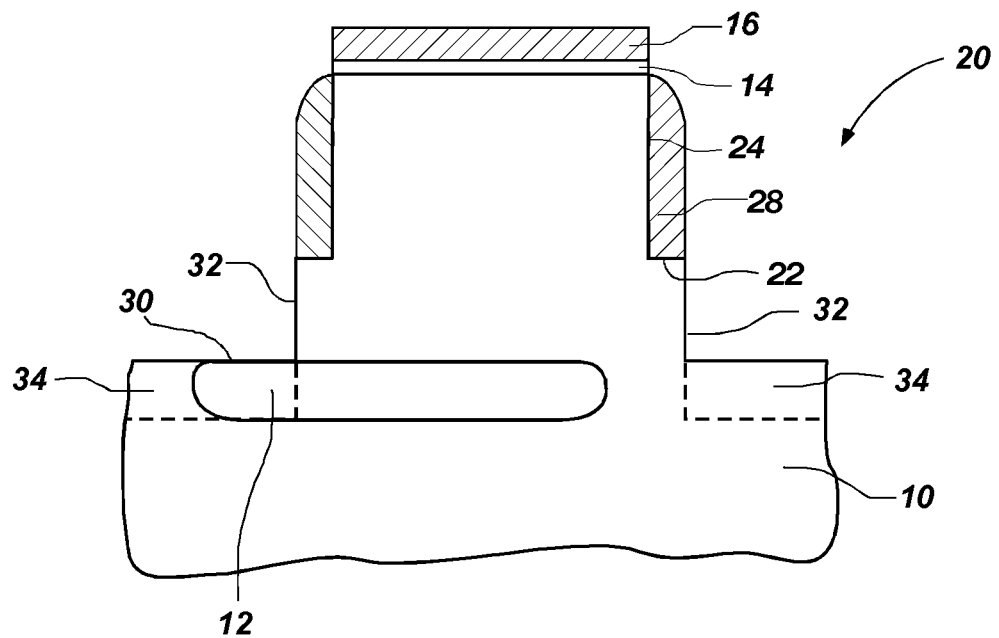
FIG. 4 is a cross section of a further formation of the structure of FIG. 3, in accordance with an embodiment of the present invention.

FIG. 4 illustrates processing of the substrate 10 in which an etch has formed a recess second bottom 30 below the level of the recess first bottom 22 and at about the depth of the implant region 12. The recess first bottom 22 now appears as a substrate ledge structure. Because of the presence of the nitride film 28, the upper first wall 24, upper second wall 26, and upper third and fourth walls (not shown) are protected, and a lower wall 32 has been formed that is approximately coplanar with the lateral extremity of the nitride film 28. In one embodiment, an anisotropic etch, such as a reactive ion etch, is used such that the nitride film 28 is left standing upon the ledge of what is left of the recess first bottom 22.

For a 0.25 micron critical-dimension (CD or minimum feature) process, the remnant of the nitride film 28 has a height in a range from about 0.1 micron to about 0.15 micron. In this dimension, the distance from the remnant of the recess first bottom 22 to the recess second bottom 30 is in a range from about 0.1 micron to about 0.3 micron. Alternatively, for a 0.15 micron critical-dimension (CD or minimum feature) process, the remnant of the nitride film 28 has a height, H, in a range from about 0.07 micron to about 0.12 micron. In this dimension, the distance from the remnant of the recess first bottom 22 to the recess second bottom 30 is in a range from about 0.08 micron to about 0.2 micron.

At the level of the recess second bottom 30, a deep implantation region 34 is formed. In one embodiment, the deep implantation region 34 is made of materials that are substantially identical to the bulk semiconductive material in the substrate 10. Implantation is carried out at an energy level that achieves self-interstitial implantation, and that causes the implantation region 34 to become amorphous enough to have an etch responsiveness that is different from the bulk semiconductive material in the substrate 10. In one embodiment, implantation conditions use a silicon source that is implanted to a monocrystalline-to-self interstitial ratio of about 3:1. By "silicon source" it is meant that silicon or another Group IV element is used, or a combination such as silicon and germanium. In one embodiment, the implanted concentration is from about $1E^{14}$ atoms/cm$^2$ to about $5E^{15}$ atoms/cm$^2$ at process conditions of ambient temperature (20° C. to about 30° C.) and an implantation energy from about 500 eV to about 30 KeV. In one embodiment, a silicon source that is substantially equivalent to the silicon chemistry of the bulk of the semiconductive substrate 10, is implanted to a concentration of about $1E^{15}$ atoms/cm$^2$ and process conditions are about 25° C. and an implantation energy of about 25 KeV. In another embodiment, the implantation energy may be on the order of about 1 KeV.

After the deep implantation, an etch process is used in subsequent processing that is selective to the amorphous material of the implantation region 34 and to the nitride film 28, but the etch process removes bulk semiconductive material in the substrate 10. In one embodiment, the etch process is a wet tetramethyl ammonium hydroxide (TMAH) etch as is known in the art. In another embodiment, the wet etch uses a potassium hydroxide (KOH) etch chemistry that is known in the art. The TMAH etch chemistry is desirable because it is selective such that it etches the bulk silicon of the substrate 10, but does not substantially etch the nitride film 28 or the deep implantation region 34. In one embodiment, the selectivity is in a range from about 5:1 to about 20:1. In another embodiment, the selectivity is about 10:1. The isotropic etch may also be combined with an anisotropic etch, either before or after the isotropic etch. By using both an isotropic and an anisotropic etch, both the downward etching and the undercutting of the nitride film 28 may be varied to suit particular applications.

Figure 5:
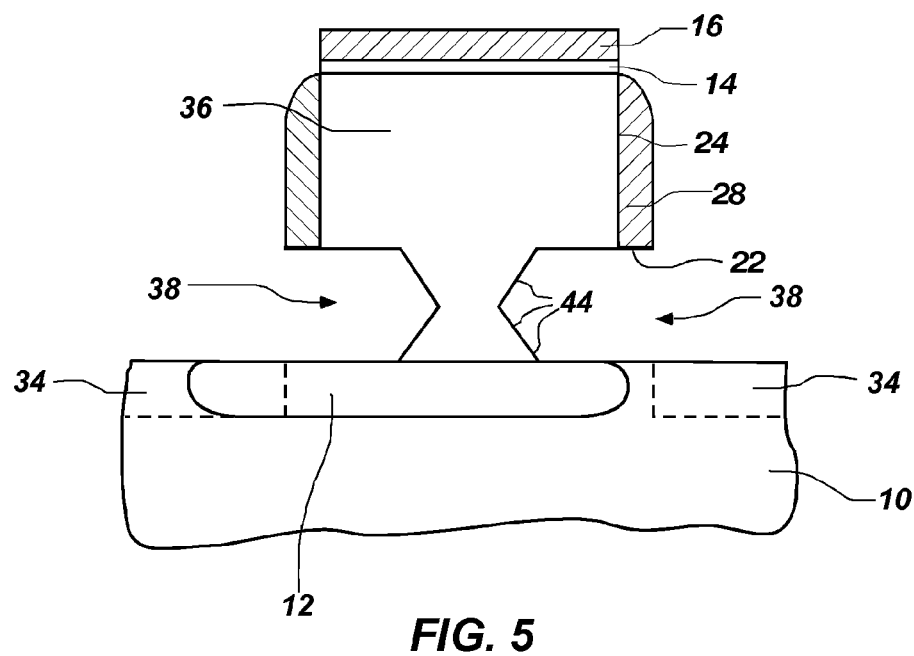
FIG. 5 is a cross section of a further formation of the structure of FIG. 4, in accordance with an embodiment of the present invention.

Various wet TMAH etch processes are known that are selective to amorphous silicon and to nitride films (or oxide films, or oxynitride films), and that isotropically etch bulk monocrystalline silicon along crystallographic planes. FIG. 5 illustrates the results of a TMAH etch that has formed a lateral cavity 38 that has undercut what will become the active area 36. By this undercutting etch, the active area 36 has been mostly isolated from the bulk semiconductive material in the substrate 10, at the level of the ledge that is formed at the recess first bottom 22.

Under the etch conditions, and due to the scale of the lateral cavity 38, a distinctive contour is formed therein. The TMAH etch has an effect along crystallographic planes such that a faceted contour may appear within the lateral cavity 38. Accordingly, faceted surface 44 is illustrated on one side. However, these are depicted in arbitrary shape, angle and size for illustrative purposes, and the specific shapes, angles, and sizes of the faceted surfaces will depend upon the crystallographic orientation of the bulk semiconductive material in the substrate 10 and upon the specific etch process and conditions, among other factors. According to the specific etch conditions, a photomicrographic view of the lateral cavity 38 depicts subtended crystallographic planes of bulk semiconductive material in the substrate 10 that have been exposed by the TMAH etch. It should be noted that there are other various methods for forming the lateral cavity 38, which are also contemplated to be within the scope of the present invention.

Figure 6:
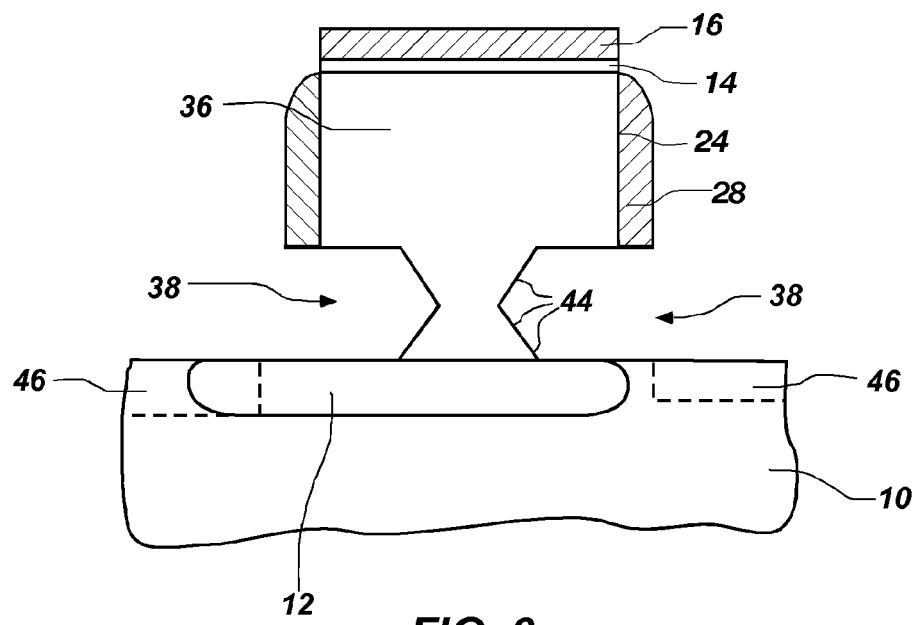
FIG. 6 is a cross section of a further formation of the structure of FIG. 5, in accordance with an embodiment of the present invention.

After formation of the lateral cavity 38, the deep implantation region 34 is treated to form an annealed implantation region 46 as illustrated in FIG. 6. The annealed implantation region 46 has been returned to substantially the same semiconductive quality as the bulk semiconductive material in the substrate 10 by substantially repairing the monocrystalline lattice in what was the deep implantation region 34 (FIG. 5). The conditions for annealing are known in the art and depend upon the depth of the deep implantation region 34, the available thermal budget of the process, and other factors.

Figure 7:
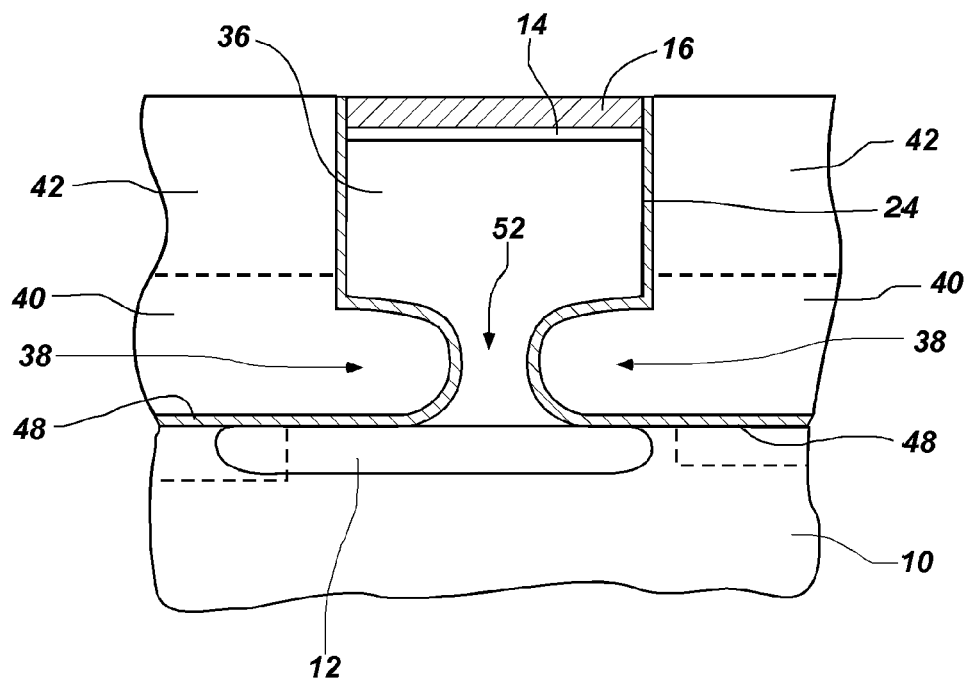
FIG. 7 is a cross section of a further formation of the structure of FIG. 6, in accordance with an embodiment of the present invention.

FIG. 7 illustrates further processing according to an embodiment. In one embodiment, the exposed surface of the active area 36 and the bulk semiconductive material of the substrate 10 is oxidized, in one embodiment, using minimal conditions. The minimal oxidation conditions relate to a lowered workpiece stress in the lateral cavity 38. An oxidation 48, such as a shallow trench isolation (STI) oxide, is formed that provides a thin oxide layer. The oxidation 48 consumes silicon downward into the substrate 10, sideways into the faceted area 44 (FIG. 6), and upward into bottom of the active area 36. In one photolithographic process, such as a 0.25 micron process, the dimensions are about 0.03 micron growth of oxidation 48 toward the remaining portion of a substrate stem 52. In another photolithographic process, such as a 0.15 micron process, the dimensions are about 0.01 micron toward the substrate stem 52 that remains to this stage of processing.

FIG. 7 also depicts the protective layer 16 remaining while the nitride film 28 has been removed. This embodiment occurs where the protective layer 16 is chemically different from the nitride film 28, such as a polysilicon protective layer 16. In another embodiment, where the protective layer 16 is a nitride material, it is removed with the nitride film.

For one photolithographic process, the amount of the substrate 10 that is consumed sideways by the isotropic etch, for example, is approximately 0.07 micron on each side of the active area 36. That oxidation process leaves the substrate stem 52, which connects the substrate that will become the active area 36 to the bulk of the substrate 10. In this embodiment, the substrate stem 52 is on the order of about 0.05 micron by 0.05 micron. Oxidation time will depend upon the area of the partially isolated structure that forms the active area 36 and the other parameters. In one embodiment, oxidation parameters include a processing temperature from about 850° C. to about 1,100° C. The ambient is with wet or dry oxygen ($O_2$) or radicals or ozone, atmospheric pressure or higher. In one example, a temperature of about 850° C. and a wet oxygen ambient is applied for a sufficient time to allow about 0.03 micron horizontal oxidation under the active area 36, and about 0.01 micron vertical oxidation upwardly into the active area 36. After the thermal oxidation process, oxidation is formed to fill lateral cavity 38 and provide support and isolation to the active area 36 supported by substrate stem 52.

In one embodiment, a first oxide 40 is formed for filling the lateral cavity 38. The first oxide 40 may be formed of a spin-on dielectric (SOD) material, high-density plasma (HDP) oxide material or other dielectric fill. When a SOD material is desired, the layer 48 may be configured as a nitride and oxide combination layer to allow the proper densification of the SOD material. By way of example, spin-on dielectric oxide (SOD) material provides good oxidation for trenches or cavities, such as lateral cavity 38, which are formed according to sub-micron dimensions. The spin-on dielectric (SOD) process entails dripping a liquid precursor onto the wafer surface in a predetermined amount. The wafer is subjected to rapid spinning (e.g., up to 6000 rpm). The spinning uniformly distributes the liquid on the surface by centrifugal forces allowing low points to be filled. Finally, the coating is baked in order to solidify the material. Further details of spin-on dielectric (SOD) processes are known by those of ordinary skill in the art and may include processes described in U.S. Pat. No. 7,112,513, the disclosure of which is incorporated herein by reference. In yet another embodiment, a TEOS material may be used instead of a SOD material. Furthermore, combinations of the oxide materials are also contemplated.

While a continuous fill of oxide material into the cavity 38 for foil ling a planar isolation to the protective layer 16 is contemplated, the present embodiment illustrates a second oxide 42 formed by an oxidation process (e.g., high-density plasma (HDP) oxide material, spin-on dielectric (SOD) material or other dielectric fill). The second oxide 42 may contain the same dielectric material or a dielectric material different from the first oxide 40. Since the lateral cavity 38 has been filled by the first oxide 40, the second oxide 42 may be formed according to more aggressive oxidation processes.

Figure 8:
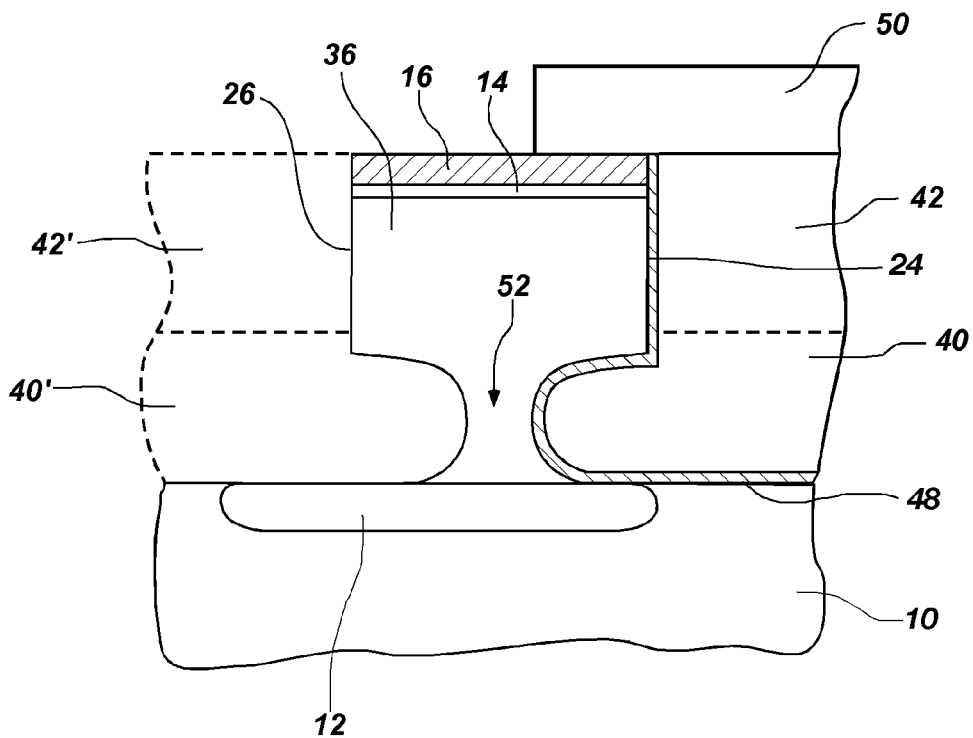
FIG. 8 is a cross section of a further formation of the structure of FIG. 7, in accordance with an embodiment of the present invention.

FIG. 8 illustrates further processing according to an embodiment of the present invention. A mask 50 is formed and patterned upon the protective layer 16 and the second oxide 42 on one side of the active area 36. In one embodiment, the mask 50 is a photoresist material that is spun-on, exposed, cured, and patterned. The mask 50 protects one or more sides of the active area 36 from process steps occurring on at least one other side of active area 36. The mask 50 provides protection from removal of the first oxide 40 and second oxide 42 on at least one side of the active area 36. An etching process exposes the regions unprotected by the mask 50. In the present etch process, the protective layer 16 and the mask 50 allow the first oxide 40' and the second oxide 42' to be removed for the formation of a vertical gate along at least one side of the active area 36.

Figure 9:
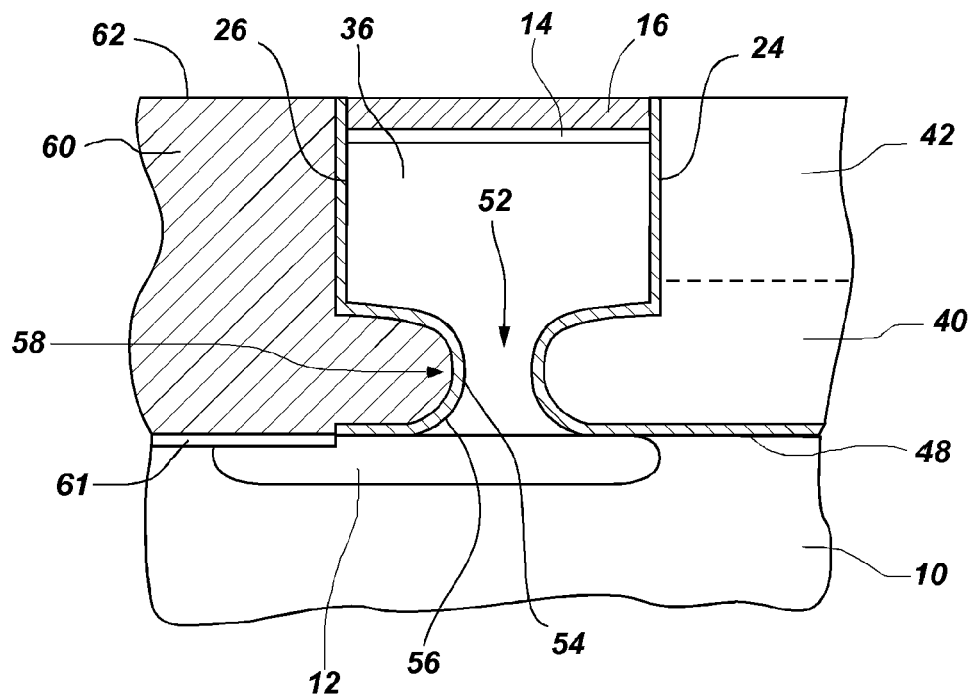
FIG. 9 is a cross section of a further formation of the structure of FIG. 8, in accordance with an embodiment of the present invention.

FIG. 9 illustrates further processing according to an embodiment of the present invention. A minimal oxidation in the form of gate oxide 54 is formed along an open upper second wall 26 of active area 36 and along an open cavity wall 56 of substrate stem 52. The continuous gate oxide 54 allows for the formation of a vertical transistor along active area 36 and substrate stem 52. A conductive material 60 is formed over the gate oxide 54 to create the vertical gate 58 on at least one side of the substrate stem 52. Furthermore, an n-type junction extension 61 is diffused from the poly fill area, which results in providing a desirable electrical contact between conductive material 60 and the implant region 12. In one embodiment, conductive material 60 (e.g., polysilicon or metal) forms a continuous conductor along the z-direction (i.e., into and out of the illustrated figure and parallel with the word line, which is perpendicular with the digit line) for coupling with a read/write enable signal 62. Furthermore, the proximity of adjacent memory cells may be reduced by placing a single contact at the end of the continuous conductor of the read/write enable signal 62.

Figure 10:
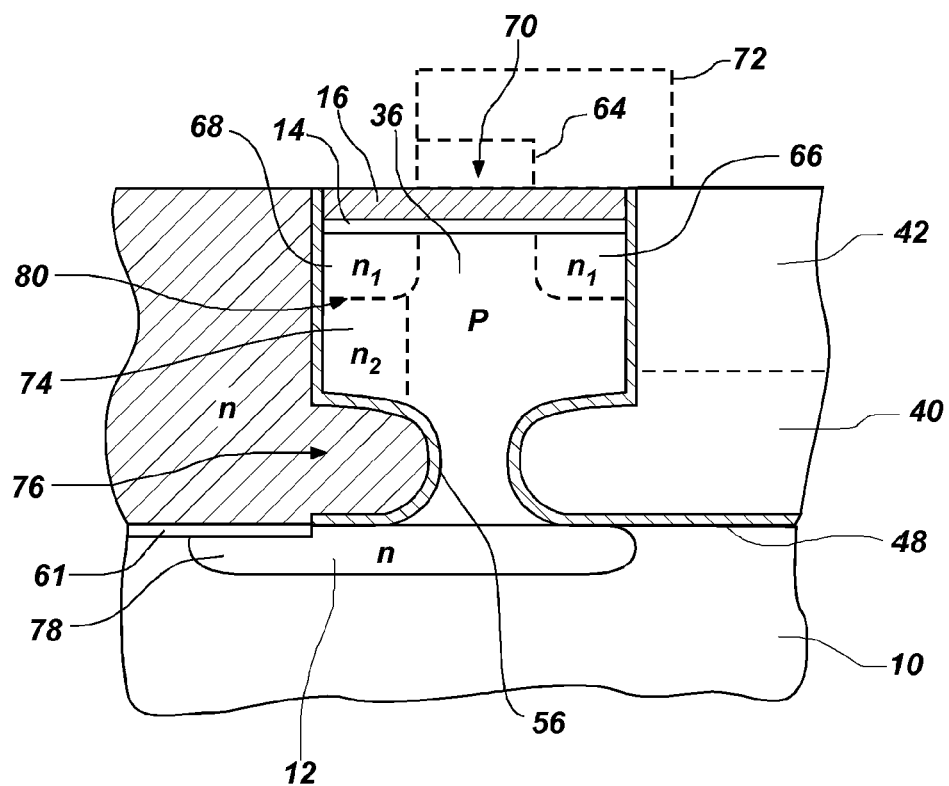
FIG. 10 is a cross section of a further formation of the structure of FIG. 9, in accordance with an embodiment of the present invention.

FIG. 10 illustrates further processing of the structure, according to an embodiment of the present invention. The active area 36 is implanted according to mask 64 to form a first drain region 66 and first source region 68, configured as a floating source region, of a forthcoming pass transistor 70. The pass transistor 70 is gated by a word line and the first drain region 66 is connected to a digit line for reading and writing by a sense amplifier (not shown). The active area 36 is further implanted according to mask 72 to form a second drain region 74, which in combination with first source region 68, forms the drain region, referred to hereafter as a common region 80, for the vertically configured read/write enable transistor 76. A second source region 78 for the vertically configured read/write enable transistor 76 results from the implant region 12.

Figure 11:
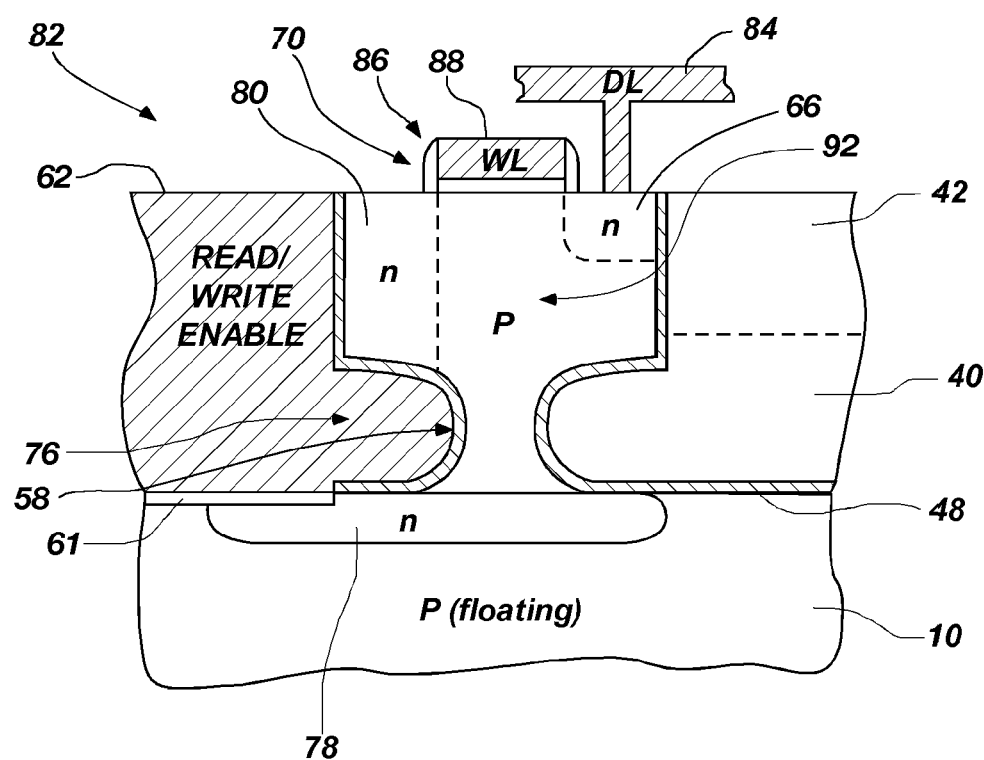
FIG. 11 is a cross section of a further formation of the structure of FIG. 10, in accordance with an embodiment of the present invention.

FIG. 11 illustrates further processing of the structure, according to an embodiment of the present invention. A capacitor-less memory cell 82 including a pass transistor 70 and a read/write enable vertical transistor 76 is formed on the active area 36 according to a partial SOI process. The pass transistor 70 at the first drain region 66 couples to a digit line 84 and at the gate 86 couples to the word line 88. The source region of the pass transistor 70 is configured as a floating source at common region 80. The vertically configured read/write enable transistor 76 includes the vertical gate 58, a drain region located at the common region 80 and the second source region 78 resulting from implant region 12 (FIG. 1). The vertical gate 58 couples to the read/write enable signal 62, which is activated during reading of the capacitor-less memory cell 82.

Figure 12:
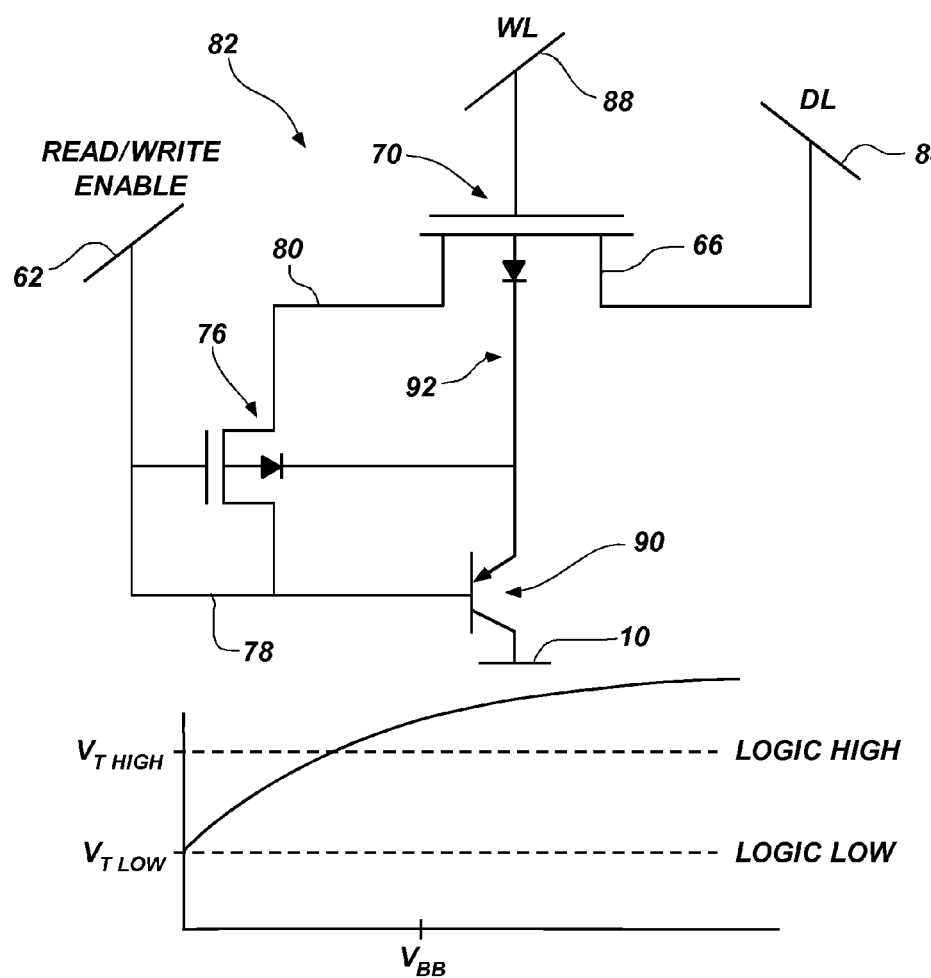
FIG. 12 is a circuit diagram of a capacitor-less memory cell, in accordance with an embodiment of the present invention.

FIG. 12 illustrates a circuit diagram of the capacitor-less memory cell 82, in accordance with an embodiment of the present invention. The capacitor-less memory cell 82 is illustrated to include pass transistor 70 coupled with the read/ write enable transistor 76. The various control signals, namely word line 88 and read/write enable signal 62, respectively, control the gates of the pass transistor 70 and the read/write enable transistor 76. The digit line 84 is coupled to the first drain region 66 of pass transistor 70. A bipolar junction transistor (BJT) 90 is also illustrated as the dominant parasitic device. In general, information is stored in the capacitor-less memory cell 82 by charging or discharging the channel region of the pass transistor 70. The channel region of the pass transistor 70 is isolated according to the partial SOI process described hereinabove and in addition to the gated-diode configuration of the read/write enable transistor 76. Such a configuration results in a low leakage from the channel region and accommodates charge storage in the channel region.

During operation when the capacitor-less memory cell is neither being written to or read from, the read/write enable signal 62 is set at less than the threshold voltage of the vertical read/write enable transistor 76 but greater than the VBE of about, for example, 0.55 V. First and second logic states are written into the capacitor-less memory cell according to charge stored in the floating body region 92 (FIGS. 11 and 12).

A first logic state, such as a low logic state, is written into the capacitor-less memory cell by storing charge in the floating body region 92. The charging of the floating body region 92 occurs when the read/write enable transistor 76 is turned off by applying a negative voltage (e.g., about $-0.6V$ to $-1V$) as the read/write enable signal 62. The p-type substrate 10 is set to 0V or allowed to float. This condition results in low conduction through the pass transistor 70 during a read operation since the threshold voltage of the pass transistor is higher (e.g., about +1V) and further since the VBB<<VBE as charge has been added to the floating body region 92.

A second logic state, such as a high-logic state, is written into the capacitor-less memory cell by depleting or discharging the charge from the floating body region 92. Discharging occurs when the read/write enable transistor 76 is turned off by applying a positive voltage (e.g., about +0.6V) to the read/write enable signal 62 and applying a positive voltage (e.g., about +1V) to the p-type substrate 10. This condition results in a high conduction through the pass transistor 70 during a read operation since the threshold voltage of the pass transistor is lower (e.g., about 0.2V) and further since the VBB≈VBE−0.1V as charge has been discharged from the floating body region 92.

During a read operation of the capacitor-less memory cell, the logic state is read to the digit line 84 when the word line 88 is high (i.e., between the threshold voltage of the pass transistor indicating a high-logic state and the threshold voltage of the pass transistor indicting a low-logic state). Additionally, the read/write enable transistor 76 is turned on by applying a voltage to the read/write enable signal 62 that is greater than the threshold voltage of the read/write enable transistor 76 and the p-type substrate 10 is floating.

Since there is finite leakage in the floating body region 92, adequate electron concentrations must be maintained in order to preserve the stored logic states. Therefore, the capacitor-less memory cell may be characterized as a form of a Dynamic Random Access Memory (DRAM). Accordingly, refresh operations need to be periodically performed with the period being determined based upon the specific processes implemented.

Figure 13:
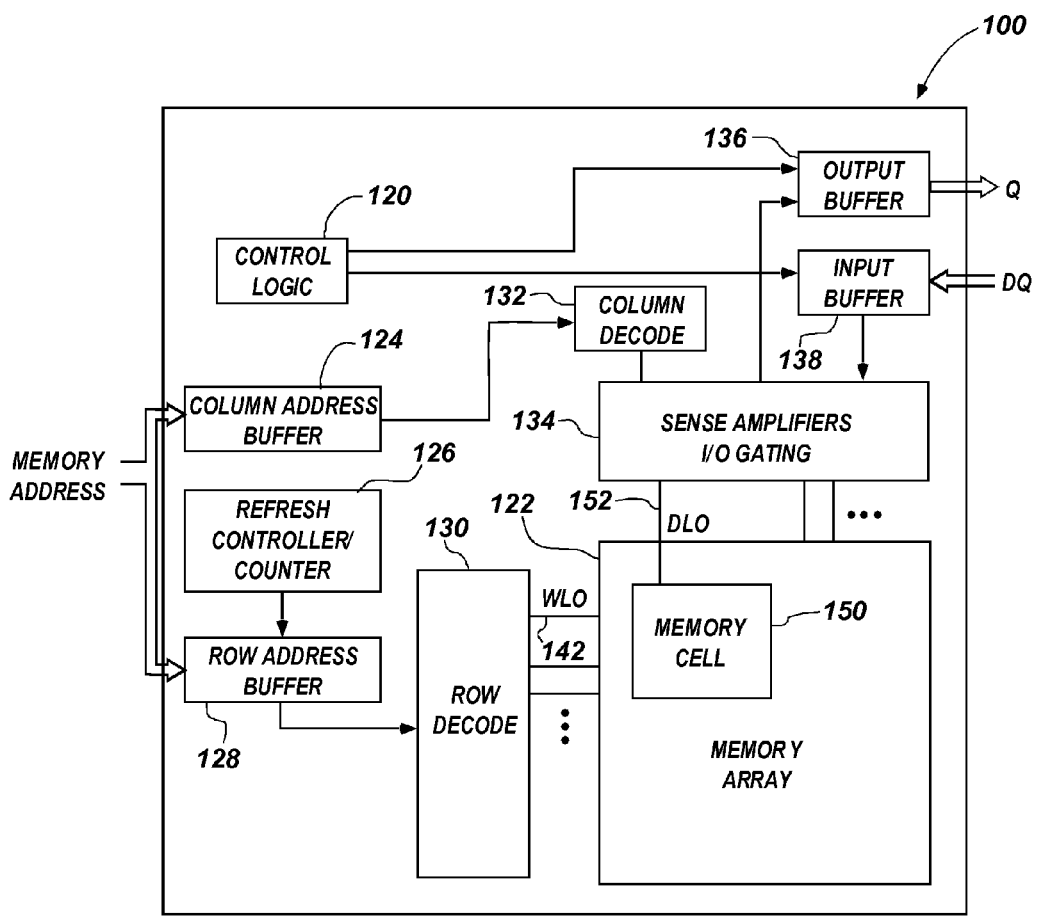
FIG. 13 is a block diagram of a memory device, in accordance with an embodiment of the present invention.

FIG. 13 is a block diagram of a memory device, in accordance with an embodiment of the present invention. A DRAM memory device 100 includes control logic circuit 120 to control read, write, erase and perform other memory operations. A column address buffer 124 and a row address buffer 128 are adapted to receive memory address requests. A refresh controller/counter 126 is coupled to the row address buffer 128 to control the refresh of the memory array 122. A row decode circuit 130 is coupled between the row address buffer 128 and the memory array 122. A column decode circuit 132 is coupled to the column address buffer 124. Sense amplifiers-I/O gating circuit 134 is coupled between the column decode circuit 132 and the memory array 122. The DRAM memory device 100 is also illustrated as having an output buffer 136 and an input buffer 138. An external processor may be coupled to the control logic circuit 120 of the DRAM memory device 100 to provide external commands.

A capacitor-less memory cell 150 of the memory array 122 is shown in FIG. 13 to illustrate how associated memory cells are implemented in the present invention. States or charges are stored in the capacitor-less memory cell 150 that correspond to a data bit. A word line WL0 142 is coupled to the gate of the pass transistor of the capacitor-less memory cell 150. When the word line WL0 142 is activated, the charge stored in the capacitor-less memory cell 150 causes a determinable amount of current to flow or to not flow to the digit line DL0 152 based upon the logic state stored in the capacitor-less memory cell. Digit line DL0 152 is coupled to a sense amplifier in circuit 134.

Figure 14:
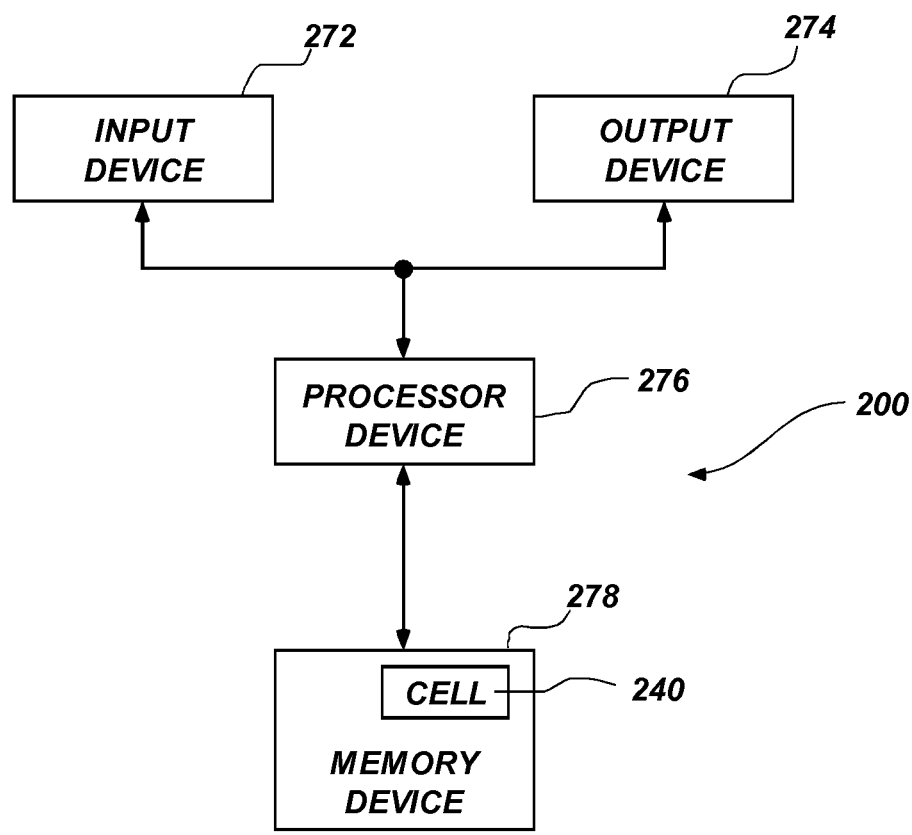
FIG. 14 is a block diagram of an electronic system, in accordance with an embodiment of the present invention.

FIG. 14 is a block diagram of an electronic system, in accordance with an embodiment of the present invention. The electronic system 200 includes an input device 272, an output device 274, and a memory device 278, all coupled to a processor device 276. The memory device 278 incorporates at least one capacitor-less memory cell 240 of one or more of the preceding embodiments of the present invention.

Figure 15:
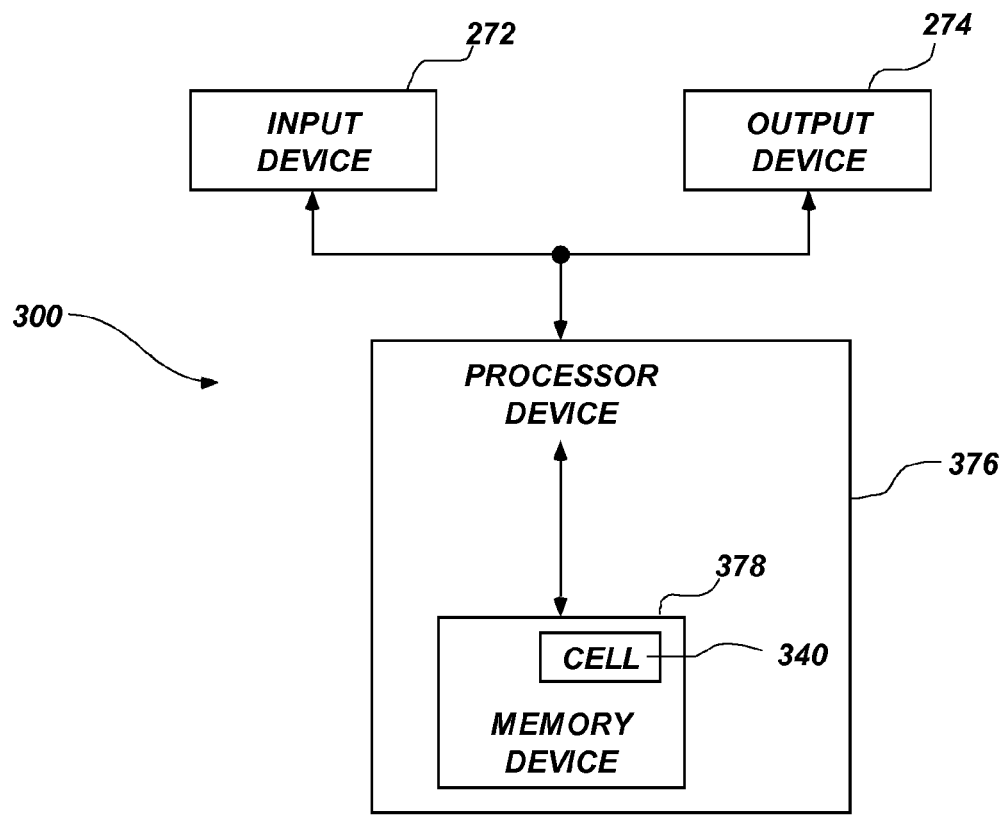
FIG. 15 is a block diagram of an electronic system, in accordance with another embodiment of the present invention.

FIG. 15 is a block diagram of an electronic system, in accordance with another embodiment of the present invention. The electronic system 300 includes an input device 272, an output device 274, and a processor device 376 incorporating therein a memory device 378, which includes at least one capacitor-less memory cell 340. As stated, the disclosed capacitor-less memory cell implemented using a partial SOI process does not require the process fabrication steps for forming large data retention capacitors. Therefore, the fabrication processes for forming the capacitor-less memory device, according to the embodiments described herein, are compatible with the fabrication processes for forming logic devices such as a processor device. Accordingly, a memory device incorporating the capacitor-less memory cell described herein may be integrated onto the processor die for close integration.

Figure 16:
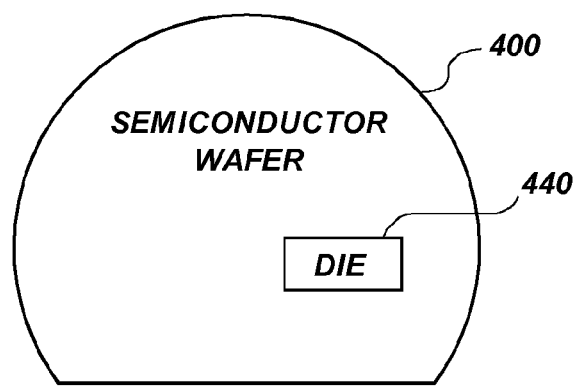
FIG. 16 is a diagram of a semiconductor wafer including an integrated circuit die incorporating a memory cell of one or more of the previous embodiments, in accordance with a further embodiment of the present invention.

FIG. 16 is a diagram of a semiconductor wafer including an integrated circuit die incorporating the memory array and capacitor-less memory cells of one or more of the previous embodiments, in accordance with a further embodiment of the present invention. As shown in FIG. 16, a semiconductor wafer 400 includes a yet-to-be cut integrated circuit die 440 that incorporates one or more capacitor-less memory cells as herein disclosed.

The processes and devices described above illustrate embodiments of methods and devices out of many that may be used and produced according to the embodiments of the present invention. The above description and drawings illustrate embodiments that provide significant features and advantages of the present invention. It is not intended, however, that the present invention be strictly limited to the above-described and illustrated embodiments.

Although the present invention has been shown and described with reference to particular embodiments, various additions, deletions and modifications that will be apparent to a person of ordinary skill in the art to which the invention pertains, even if not shown or specifically described herein, are deemed to lie within the scope of the invention as encompassed by the following claims.

What is claimed is:

1. An apparatus, comprising:
a capacitor-less memory cell including a vertically-oriented transistor and a horizontally-oriented transistor formed on an active area of a bulk substrate, the horizontally-oriented transistor having a source region common with a drain region of the vertically-oriented transistor in the active area.

2. The apparatus of claim 1, wherein at least a portion of the active area is at least substantially physically isolated from the bulk substrate by a gate of the vertically-oriented transistor configured along a lateral cavity extending into the bulk substrate and undercutting the portion of the active area.

3. The apparatus of claim 2, wherein the capacitor-less memory cell further includes a substrate stem connecting the active area and the bulk substrate, the substrate stem defining the lateral cavity.

4. The apparatus of claim 3, wherein the vertically-oriented transistor includes a gate oxide continuously extending along a side of the active area and the substrate stem.

5. The apparatus of claim 4, wherein the gate of the vertically-oriented transistor includes a conductive material coupled with the gate oxide continuously extending along a side of the active area and the substrate stem.

6. The apparatus of claim 1, further comprising an array of capacitor-less memory cells including the capacitor-less memory cell.

7. The apparatus of claim 6, further comprising control logic coupled to the array of capacitor-less memory cells, the control logic configured to control at least one memory operation selected from the group consisting of a read operation, a write operation, an erase operation, and a refresh operation.

8. The apparatus of claim 7, further comprising at least one of a memory device, a processing device, an integrated circuit, a semiconductor wafer, and an electronic system that includes the array of capacitor-less memory cells and the control logic.

9. A method, comprising:
forming a capacitor-less memory cell by forming a vertically-oriented transistor and a horizontally-oriented transistor on an active area of a bulk substrate, the horizontally-oriented transistor having a source region common with a drain region of the vertically-oriented transistor in the active area.

10. The method of claim 9, wherein forming the vertically-oriented transistor includes:
removing a portion of the bulk substrate to form a lateral cavity below the active area; and
forming a gate of the vertically-oriented transistor along a wall defining the lateral cavity.

11. The method of claim 10, further comprising coupling the vertical gate to a read/write enable signal.

12. The method of claim 10, further comprising:
forming a word line coupled to the gate of the horizontally-oriented transistor; and
forming a digit line coupled to a drain region of the horizontally-oriented transistor.

13. The method of claim 9, wherein forming the vertically-oriented transistor and the horizontally-oriented transistor includes:
forming an implant region in the bulk substrate; and
forming a pillar from the bulk substrate above at least a portion of the implant region.

14. The method of claim 13, wherein forming a pillar from the bulk substrate includes:
removing a portion of the bulk substrate to expose a plurality of upper walls of the pillar;
disposing a protective material on the plurality of upper walls of the pillar; and
removing an additional portion of the bulk substrate to expose a plurality of lower walls of the pillar that extend to the implant region.

15. The method of claim 14, further comprising:
forming a substrate stem in the bulk substrate by forming a lateral cavity in the plurality of lower walls to at least substantially isolate the active area from the bulk substrate below the substrate stem; and
forming a gate of the vertically-oriented transistor along at least one wall of the substrate stem.

16. The method of claim 10, wherein forming the horizontally-oriented transistor includes:
implanting the active area using a first mask to form a drain region and the source region of the horizontally-oriented transistor; and
implanting the active area using a second mask that covers the drain region of the horizontally-oriented transistor and exposes the source region of the horizontally-oriented region to form the drain region of the vertically-oriented transistor common with the source region of the horizontally oriented transistor.

17. A method of accessing a capacitor-less memory cell, the method comprising:
accessing a charge of a floating body region of an active area of a capacitor-less memory cell that includes a vertically-oriented transistor and a horizontally-oriented transistor on the active area of a bulk substrate, the horizontally-oriented transistor having a source region common with a drain region of the vertically-oriented transistor in the active area.

18. The method of claim 17, wherein accessing a charge of a floating body region includes storing information in the floating body region.

19. The method of claim 17, wherein accessing a charge of a floating body region includes at least one of charging and discharging a channel region of the horizontally-oriented transistor.

20. The method of claim 17, wherein accessing a charge includes at least one of reading, writing, erasing, and refreshing the charge.

* * * * *